United States Patent
Giusti et al.

(10) Patent No.: US 12,225,824 B2
(45) Date of Patent: Feb. 11, 2025

(54) PROCESS FOR MANUFACTURING A THIN-FILM PIEZOELECTRIC MICROELECTROMECHANICAL STRUCTURE HAVING IMPROVED ELECTRICAL CHARACTERISTICS

(71) Applicant: STMicroelectronics S.r.l., Agrate Brianza (IT)

(72) Inventors: Domenico Giusti, Caponago (IT); Irene Martini, Bergamo (IT); Davide Assanelli, Milan (IT); Paolo Ferrarini, Casatenovo (IT); Carlo Luigi Prelini, Seveso (IT); Fabio Quaglia, Pizzale (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 534 days.

(21) Appl. No.: 17/485,719

(22) Filed: Sep. 27, 2021

(65) Prior Publication Data
US 2022/0102618 A1 Mar. 31, 2022

(30) Foreign Application Priority Data
Sep. 28, 2020 (IT) .......................... 102020000022813

(51) Int. Cl.
*H10N 30/057* (2023.01)
*B81B 7/02* (2006.01)
(Continued)

(52) U.S. Cl.
CPC ............. *H10N 30/101* (2024.05); *B81B 7/02* (2013.01); *H10N 30/057* (2023.02);
(Continued)

(58) Field of Classification Search
CPC .. H10N 30/101; H10N 30/057; H10N 30/308; H10N 30/202; H10B 53/00;
(Continued)

(56) References Cited

U.S. PATENT DOCUMENTS

| | | | | |
|---|---|---|---|---|
| 5,481,490 A | * | 1/1996 | Watanabe | H10B 53/00 |
| | | | | 257/E27.104 |
| 6,336,716 B1 | * | 1/2002 | Sakamaki | H10N 30/078 |
| | | | | 347/68 |

(Continued)

FOREIGN PATENT DOCUMENTS

| CN | 206542386 U | 10/2017 |
|---|---|---|
| CN | 216512849 U | 5/2022 |
| DE | 102018213735 A1 | 2/2020 |

OTHER PUBLICATIONS

IT Search Report and Written Opinion for IT Appl. No. 102020000022813 dated Jun. 7, 2021 ((8 pages).

(Continued)

*Primary Examiner* — Donghai D Nguyen
(74) *Attorney, Agent, or Firm* — Crowe & Dunlevy LLC

(57) ABSTRACT

A piezoelectric microelectromechanical structure is provided with a piezoelectric stack having a main extension in a horizontal plane and a variable section in a plane transverse to the horizontal plane. The stack is formed by a bottom-electrode region, a piezoelectric material region arranged on the bottom-electrode region, and a top-electrode region arranged on the piezoelectric material region. The piezoelectric material region has, as a result of the variable section, a first thickness along a vertical axis transverse to the horizontal plane at a first area, and a second thickness along the same vertical axis at a second area. The second thickness is smaller than the first thickness. The structure at (Continued)

the first and second areas can form piezoelectric detector and a piezoelectric actuator, respectively.

5 Claims, 10 Drawing Sheets

(51) Int. Cl.
    *H10N 30/00*         (2023.01)
    *H10N 30/30*         (2023.01)
    *H10N 30/87*         (2023.01)
    *H10N 30/20*         (2023.01)

(52) U.S. Cl.
    CPC ......... *H10N 30/308* (2023.02); *H10N 30/871* (2023.02); *B81B 2201/0271* (2013.01); *H10N 30/202* (2023.02); *H10N 30/302* (2023.02)

(58) Field of Classification Search
    CPC .. B81B 2201/0271; B41J 2/161; Y10T 29/42; Y10T 29/49005
    See application file for complete search history.

(56) References Cited

U.S. PATENT DOCUMENTS

| | | | |
|---|---|---|---|
| 7,923,903 B2* | 4/2011 | Fujii | ........................ B41J 2/161 |
| | | | 310/331 |
| 11,152,559 B2* | 10/2021 | Kojima | ................ H10N 30/078 |
| 2007/0097181 A1 | 5/2007 | Fujii et al. | |
| 2008/0062230 A1 | 2/2008 | Nozu et al. | |
| 2008/0186364 A1 | 8/2008 | Sugahara et al. | |
| 2009/0284568 A1 | 11/2009 | Yazaki | |
| 2015/0212109 A1 | 7/2015 | Kang et al. | |
| 2017/0197414 A1 | 7/2017 | Naganuma et al. | |
| 2018/0152169 A1* | 5/2018 | Goto | .................. H03H 9/02574 |
| 2018/0277734 A1 | 9/2018 | Kojima et al. | |

OTHER PUBLICATIONS

CN First Office Action and Search Report for counterpart CN Appl. No. 202111142520.2, report dated Nov. 29, 2024, 15 pgs.

\* cited by examiner

PROCESS FOR MANUFACTURING A THIN-FILM PIEZOELECTRIC MICROELECTROMECHANICAL STRUCTURE HAVING IMPROVED ELECTRICAL CHARACTERISTICS

PRIORITY CLAIM

This application claims the priority benefit of Italian Application for Patent No. 102020000022813, filed on Sep. 28, 2020, the content of which is hereby incorporated by reference in its entirety to the maximum extent allowable by law.

TECHNICAL FIELD

The present invention relates to a thin-film piezoelectric microelectromechanical structure (of the MEMS—Micro-Electro-Mechanical System—type) having improved electrical characteristics and to a corresponding manufacturing process.

BACKGROUND

Thin-film piezoelectric (TFP) MEMS structures are known, which, as shown schematically in FIG. 1A, have a piezoelectric stack 1 formed by stacking on top of one another: a bottom-electrode region 2 of an appropriate conductive material; a piezoelectric material region 4, in particular constituted by a thin film of PZT (lead zirconate titanate—Pb/Zr/Ti), arranged on the aforesaid bottom-electrode region 2; and a top-electrode region 6 of an appropriate conductive material arranged on the piezoelectric material region 4.

The piezoelectric material region 4 has a uniform thickness, for example 2 μm, between the aforesaid bottom-electrode region 2 and top-electrode region 6; in particular, the piezoelectric material region 4 comprises a plurality of PZT sub-layers stacked on top of one another to obtain the desired thickness.

In a known manner, steps for providing each PZT sub-layer by means of sol-gel deposition techniques comprise dispensing a colloidal solution (sol) on the bottom-electrode region 2; subsequent formation of the gel starting from the sol solution via spinning and drying; subsequent pyrolysis for enabling transition from the gel to the amorphous phase; and, lastly, crystallization for enabling transition to the polycrystalline phase.

The piezoelectric stack 1 is arranged over a supporting element 8, for example, made of polysilicon, which may be a membrane, a cantilever element, or some other similar element suspended above an underlying opening or cavity (here not illustrated), from which it is separated by a dielectric region 9, for example, of silicon oxide. The supporting element 8, in the example a membrane, may have a thickness of 4 μm and is able to undergo vertical deformation via the piezoelectric effect.

Piezoelectric MEMS structures can operate as actuators, in this case causing a desired deformation in the supporting element 8 in response to a voltage applied between the bottom and top electrodes 2, 6 and to the consequent deformation of the piezoelectric material region 4; for example, piezoelectric MEMS actuators are used for providing print-heads, sound-wave-generator devices or mirror devices (the so-called micromirrors).

FIG. 1B shows the vertical deformation (along a vertical axis z) of the supporting element 8 as a function of the position along the width direction of the supporting element 8, as the voltage applied between the bottom-electrode region 2 and the top-electrode region 6 varies (in the example, between 0 and 40 V). In particular, there is a maximum deformation at the center of the membrane, having a maximum extension of 300 nm (i.e. 320 nm, corresponding to the case of an applied voltage of 40 V, minus 20 nm, corresponding to the case of a zero applied voltage).

Piezoelectric MEMS structures may moreover operate as detection structures, in this case operating according to the reverse piezoelectric effect, with generation of an electrical detection signal between the bottom and top electrodes 2, 6 in response to the deformation of the piezoelectric material region 4 due to a phenomenon to be detected; for example, piezoelectric MEMS detection structures can be used for measuring the displacement of associated actuators so as to provide a closed control loop, or for detecting sound waves generated by associated generators to obtain information on the time of flight in acoustic transducer devices.

A common requirement in the production of piezoelectric MEMS structures is to improve the corresponding electrical performance, i.e., the degree of displacement given a same voltage applied to the electrodes, in the case of actuators, and the sensitivity to the quantities detected, in the case of piezoelectric detectors.

Known solutions for improving electrical performance of piezoelectric MEMS structures envisage use of doped-PZT solutions, for example, with niobium doping, or a so-called gradient-free approach. In both cases, however, the sol-gel chemical composition is modified; in addition, the doped-PZT solution is more costly, and the gradient-free approach is more complicated to implement in mass production (a wide range of process chemistries being required).

There is a need in the art to solve the problems highlighted previously, and in particular to provide a piezoelectric MEMS structure having improved electrical characteristics, and an associated manufacturing process which is simple and inexpensive to implement.

SUMMARY

Embodiments herein concern a piezoelectric microelectromechanical structure and a corresponding manufacturing process.

In an embodiment, a piezoelectric microelectromechanical structure comprises a piezoelectric stack having a main extension in a horizontal plane and a variable section in a plane transverse to said horizontal plane and formed by stacked arrangement of a bottom-electrode region; a piezoelectric material region, constituted by a film of PZT, arranged on the bottom-electrode region; and a top-electrode region arranged on the piezoelectric material region. The piezoelectric material region has, as a result of said variable section, a first thickness along a vertical axis transverse to said horizontal plane at a first area thereof, and a second thickness along the vertical axis at a second area thereof, the second thickness being smaller than the first thickness.

In an embodiment, a process for manufacturing a piezoelectric microelectromechanical structure comprises forming a piezoelectric stack having a main extension in a horizontal plane and variable section in a plane transverse to said horizontal plane. This is accomplished by forming, stacked on one another, a bottom-electrode region; a piezoelectric material region, constituted by a film of PZT, arranged on the bottom-electrode region; and a top-electrode region arranged on the piezoelectric material region. The process comprises forming the piezoelectric material region having, as a result of said variable section, a first thickness along a vertical axis transverse to said horizontal plane at a first area thereof, and a second thickness along said vertical axis (z) at a second area thereof, the second thickness being smaller than the first thickness.

BRIEF DESCRIPTION OF THE DRAWINGS

For a better understanding of the present invention, a preferred embodiment thereof is now described, purely by way of non-limiting example and with reference to the attached drawings, wherein.

DETAILED DESCRIPTION

As will be described in detail in what follows, according to an aspect of the present solution the microelectromechanical structure has a piezoelectric stack having a variable section, in particular with reference to a variable thickness of the corresponding piezoelectric material region.

The piezoelectric stack is formed on an underlying patterned structure, having an appropriate conformation, which corresponds to the aforesaid variable section of the piezoelectric stack.

As will be highlighted, the effect of the variable section is, in general, that of improving the performance and electrical characteristics of the piezoelectric microelectromechanical structure.

Figure 2:
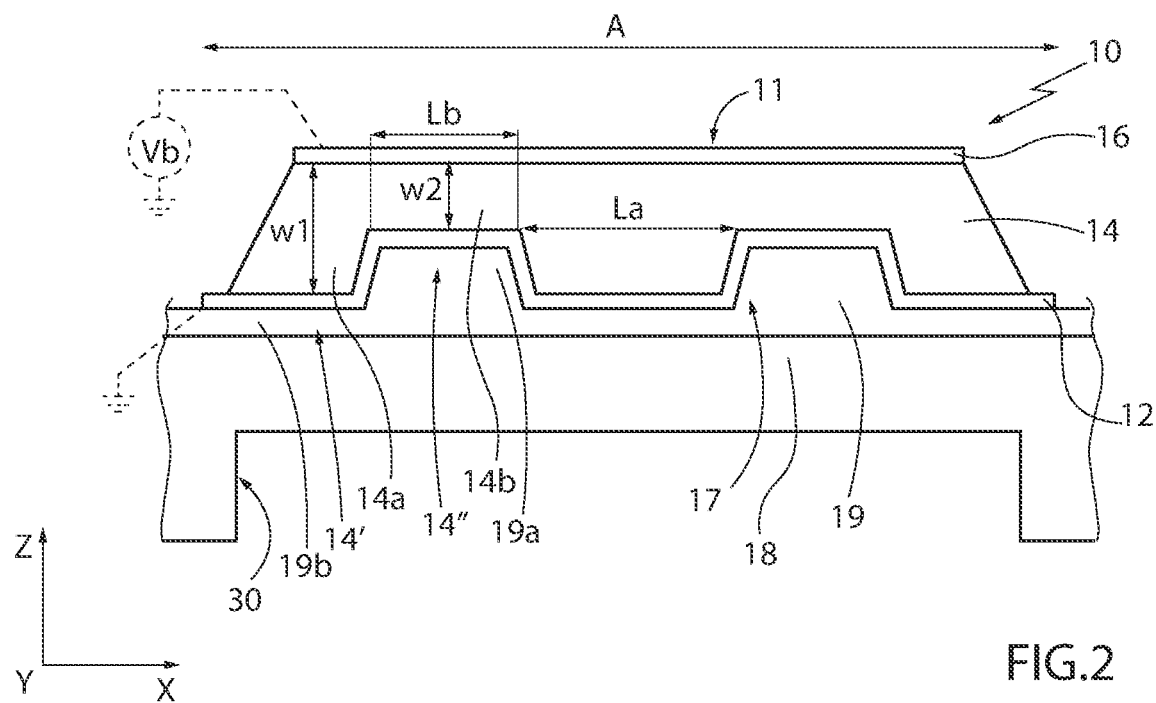
FIG. 2 is a schematic sectional view of a thin-film piezoelectric MEMS structure, according to an embodiment.

In detail, and with initial reference to FIG. 2, a piezoelectric microelectromechanical structure 10 according to an aspect of the present solution has a main extension in a horizontal plane xy and comprises a piezoelectric stack 11 formed by stacking on top of one another: a bottom-electrode region 12 of an appropriate conductive material; a piezoelectric material region 14 in particular constituted by a thin film of PZT (lead zirconate titanate (Pb/Zr/Ti)) arranged on the aforesaid bottom-electrode region 12; and a top-electrode region 16 of an appropriate conductive material arranged on the piezoelectric material region 14.

The aforesaid piezoelectric stack 11 is arranged on a supporting element 18, which is deformable along a vertical axis z orthogonal to the aforesaid horizontal plane xy. The supporting element 18, for example of polysilicon, may be a membrane suspended above an underlying opening or cavity 30 and is separated from the piezoelectric stack 11 by a dielectric region 19, for example, of silicon oxide, interposed between the supporting element 18 and the bottom-electrode region 12.

In particular, the top-electrode region 16 is substantially flat (in the aforesaid horizontal plane xy), in a resting condition, i.e., in the absence of deformation; the bottom-electrode region 12 is, instead, patterned in a manner corresponding to an underlying patterned structure 17, in this case entirely constituted by the aforesaid dielectric region 19.

Consequently, the piezoelectric stack 11 has a variable section (in a plane transverse to the horizontal plane xy, in the example of FIG. 2 in the plane xz), and in particular the piezoelectric material region 14 has a first thickness w1 along the vertical axis z at a first area 14' thereof, and a second thickness w2 along the same vertical axis z in a second area 14" thereof, the second thickness w2 being smaller than the first thickness w1.

In greater detail, the piezoelectric material region 14 has projections 14a having the first thickness w1, which jointly define the aforesaid first area 14', and recesses 14b with the second thickness w2 along the same vertical axis z, which jointly define the aforesaid second area 14", the aforesaid projections 14a being interposed between the recesses 14b along a first horizontal axis x of the horizontal plane xy.

The dielectric region 19 has, in a corresponding manner, respective projections 19a, at the recesses 14b of the overlying piezoelectric material region 14; and respective recesses 19b, at the projections 14a of the overlying piezoelectric material region 14.

As will be discussed in detail hereinafter, the piezoelectric material region 14 is formed by means of sol-gel deposition spin-coating techniques, which enable, thanks to the intrinsic properties of planarization (in particular, with the stacked layers constituting the PZT film that progressively assume a planar conformation starting from the underlying patterned structure 17), the formation of the structure described, with the top-electrode region 16, formed on the piezoelectric material region 14, that is substantially flat (even though the piezoelectric material region 14 is formed on, and shaped like, the underlying patterned structure 17).

In a possible embodiment, the first thickness w1 may, for example, be comprised between 2 μm and 3 μm. The second thickness (which corresponds to the minimum thickness of the PZT film) may be greater than or equal to 0.5 μm, preferably smaller than 1.2 μm (these values allowing to achieve a good uniformity in the deposition and subsequent planarization of the piezoelectric material region 14).

Figure 3:
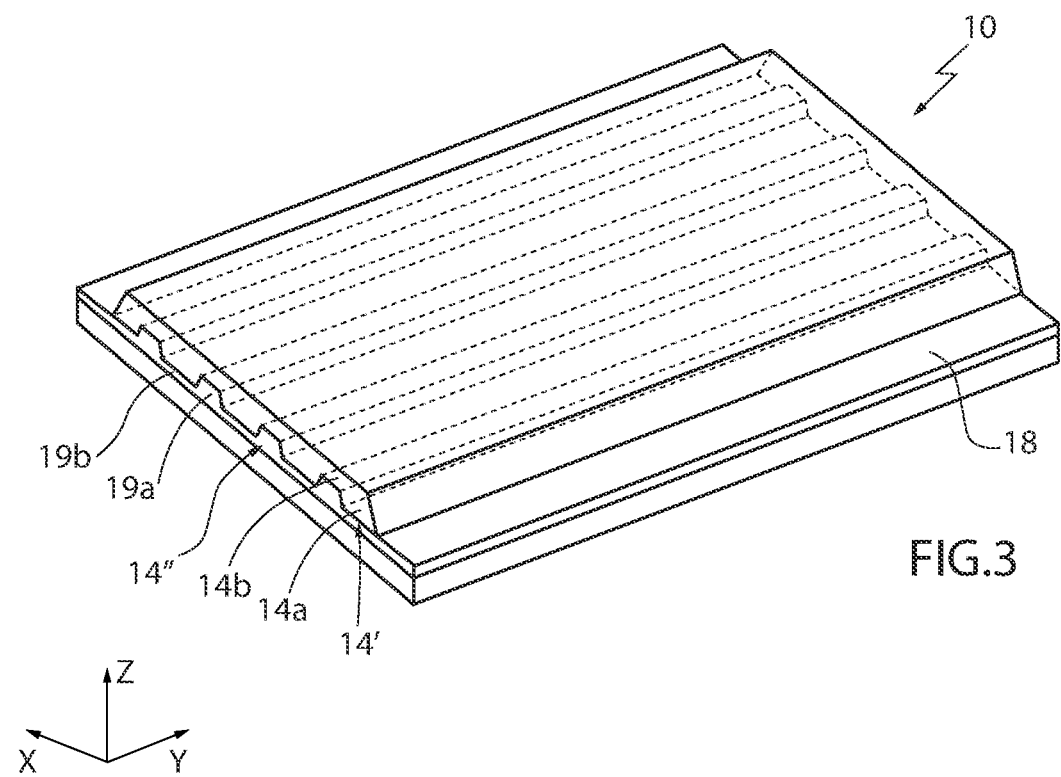
FIG. 3 is a perspective top view of a piezoelectric stack of the MEMS structure of FIG. 2.

As also illustrated in FIG. 3, in the embodiment where the piezoelectric microelectromechanical structure 10 operates as a piezoelectric actuator, the aforesaid projections 14a and the aforesaid recesses 14b of the piezoelectric material region 14 (and in a corresponding manner the respective projections 19a and the respective recesses 19b of the dielectric region 19) have a strip-like shape, elongated along a second horizontal axis y, which is orthogonal to the first horizontal axis x and forms with the first horizontal axis x the horizontal plane xy.

The piezoelectric microelectromechanical structure 10 has, in this case, a plurality of elementary units that repeat along the first horizontal axis x, each formed by a respective projection 14a and a respective recess 14b of the piezoelectric material region 14.

In greater detail, again with reference to FIG. 2 (which is not in scale, just as with the other Figures), in a possible embodiment, the aforesaid projections 14a of the piezoelectric material region 14 have a width, designated by La, along the first horizontal axis x, preferably greater than or equal to 6 μm; the aforesaid recesses 14b of the piezoelectric material region 14 have a width, designated by Lb, along the same first horizontal axis x, preferably greater than or equal to 5 μm; and the total size A occupied by the piezoelectric microelectromechanical structure 10, once again along the first horizontal axis x, is equal to n·(La+Lb), where n is the number of elementary units of the piezoelectric microelectromechanical structure 10.

During operation, application of a biasing voltage Vb between the top-electrode region 16 and the bottom-electrode region 12 causes deformation of the supporting element 18 in the direction of the vertical axis z.

Figure 4A:
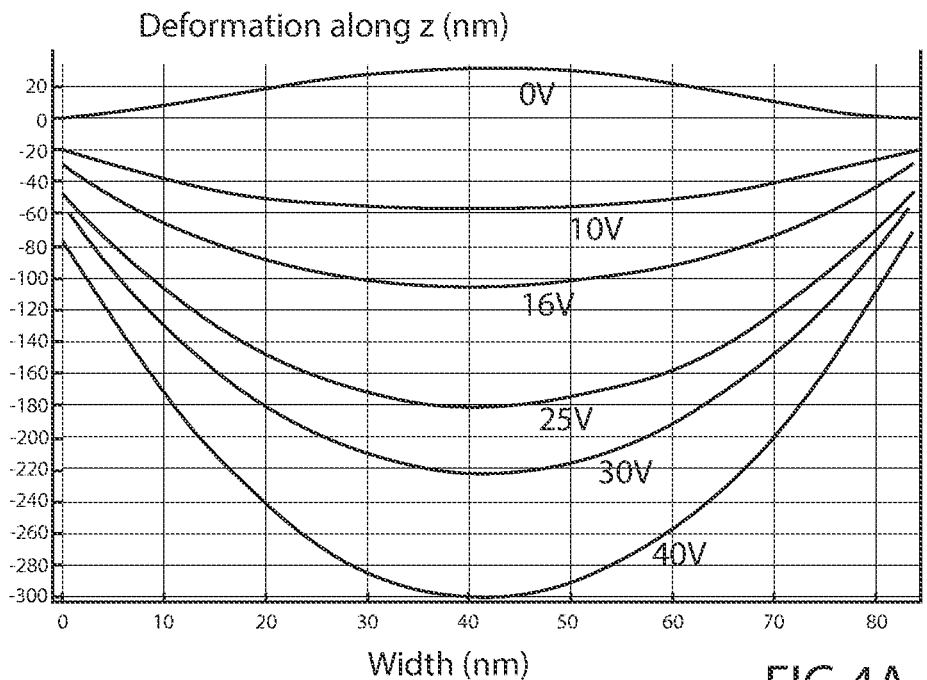
FIGS. 4A-4B are diagrams representing vertical displacements of the MEMS structure of FIG. 2, as the corresponding characteristics and the value of a biasing voltage vary.

In particular, FIG. 4A shows the vertical deformation of the supporting element 18 in the direction of the width, as the biasing voltage Vb applied between the bottom-electrode region 12 and the top-electrode region 16 varies, on the hypothesis that the supporting element 18 has a thickness of 4 μm and the recesses 14b of the piezoelectric material region 14 (having the first thickness w1 of 2 μm) have a width Lb of 5 μm.

A maximum deformation occurs at the center of the membrane, having a maximum extension of 330 nm (i.e. 300 nm, corresponding to the case of an applied biasing voltage Vb of 40 V, plus 30 nm, corresponding to the case of a zero applied voltage).

Figure 1A:
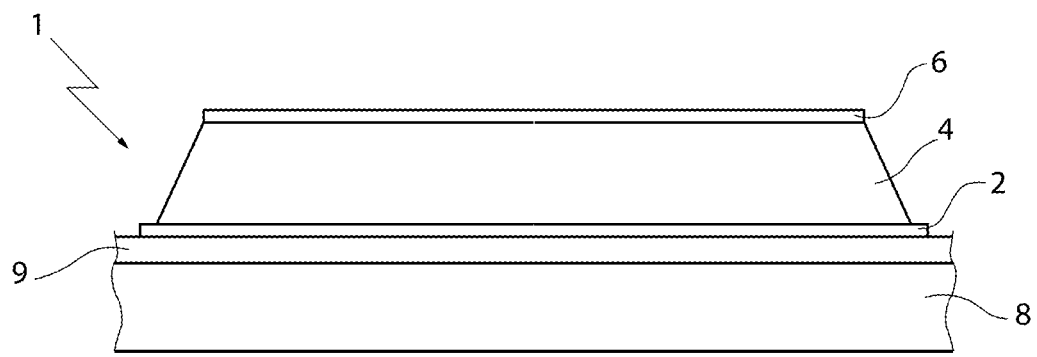
FIG. 1A is a schematic sectional view of a thin-film piezoelectric MEMS structure, of a known type.
Figure 1B:
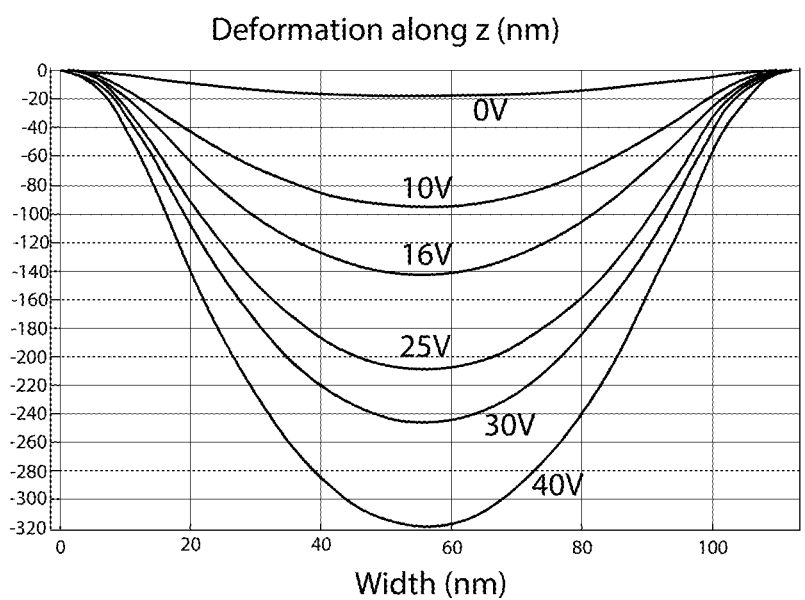
FIG. 1B is a diagram representing the piezoelectric performance of the structure of FIG. 1A.

Comparing this plot with the example of FIG. 1B (corresponding to a micromechanical structure having substantially the same configuration and size, except for the piezoelectric stack 11), it is noted a 10% increase of the maximum deformation that can be obtained.

Figure 4B:
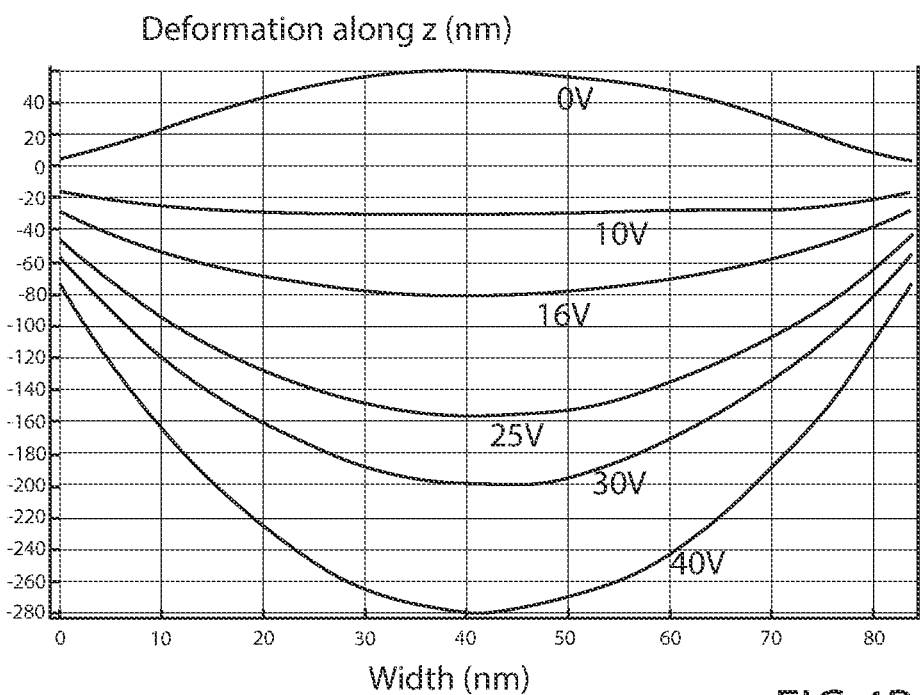

FIG. 4B shows the same plot on the hypothesis that, with the other dimensions being the same, the recesses 14b of the piezoelectric material region 14 (having once again the first thickness w1 equal to 2 μm) have a width Lb of 10 μm.

A maximum deformation is obtained at the center of the membrane, having in this case a maximum extension of 346 nm (i.e. 280 nm, corresponding to the case of a biasing voltage Vb applied of 40 V, plus 66 nm, corresponding to the case of a zero applied voltage); therefore, in this case, a 15% increase is obtained as compared to the case of constant uniform thickness of the piezoelectric material region (shown in FIG. 1B).

In general, the presence of the piezoelectric film with variable thickness enables generation, between the top and bottom electrodes, of locally variable electrical fields, and the consequent improvement in the piezoelectric performance. This improvement in performance is moreover due to the contribution of the piezoelectric coefficient d35, which intervenes in the case of PZT with variable thickness, whereas it is not exploited in the case of constant thickness.

A possible process for manufacturing the previously described piezoelectric microelectromechanical structure 10 is now discussed.

Figure 5A:
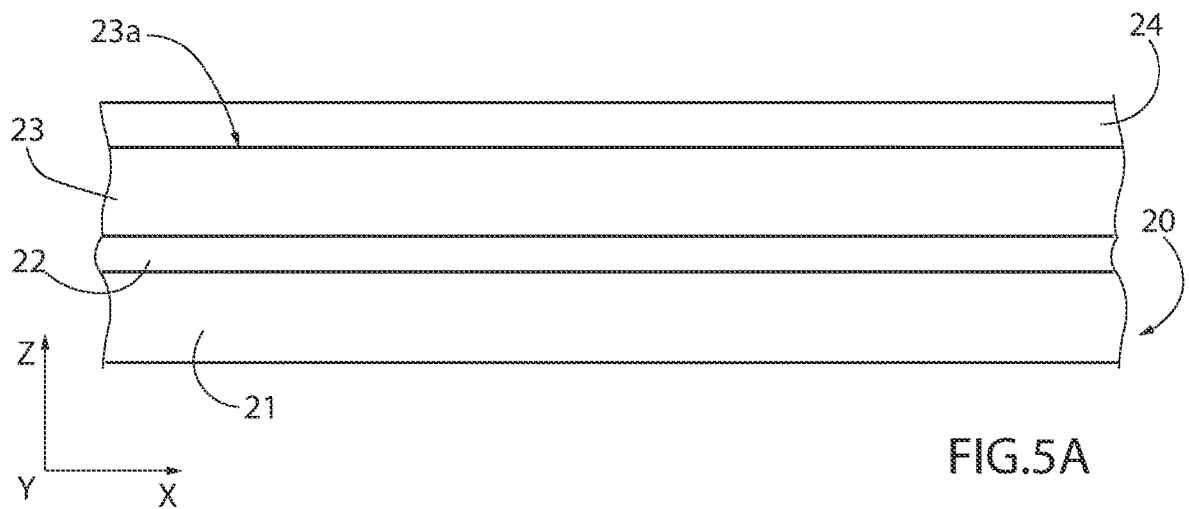
FIGS. 5A-5H are sectional views of the MEMS structure of FIG. 2 in successive steps of a corresponding manufacturing process.

As shown in FIG. 5A, the process starts with the provision of an semiconductor (silicon) on insulator (SOI) wafer 20, comprising, stacked on top of one another, a supporting layer 21, an insulating layer 22, and an active layer 23, the latter being of polycrystalline silicon and having a top surface 23a. Alternatively, as will be on the other hand evident, the following may be envisaged: oxidation of an initial silicon layer and epitaxial growth of an overlying polysilicon layer, followed by planarization of a corresponding top surface (using the CMP—Chemical Mechanical Polishing—technique).

The process initially envisages growth of a thermal-oxide layer 24 on the top surface 23a of the active layer 23.

Figure 5B:
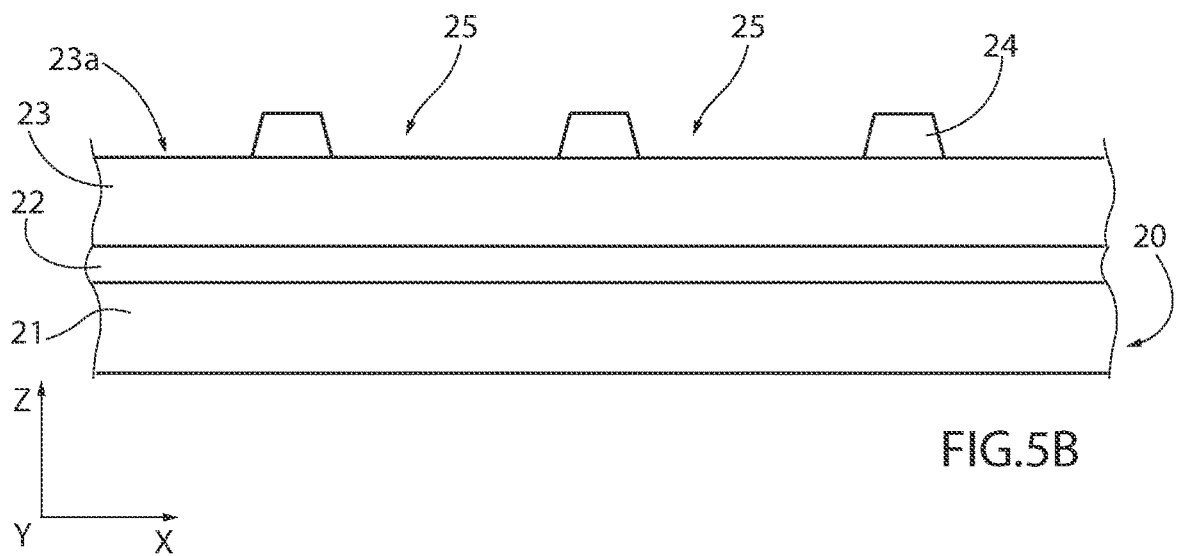

Then, in FIG. 5B, the thermal-oxide layer 24 is subjected to a photolithographic process, for defining, by means of dry etching and subsequent cleaning, openings 25 which traverse the entire thickness of the thermal-oxide layer 24, at regular intervals along the first horizontal axis x. Remaining portions of the thermal-oxide layer 24 (having substantially a same width as the recesses 14b of the piezoelectric material region 14 that will then be formed) remain between consecutive openings 25 along the first horizontal axis x.

Figure 5C:
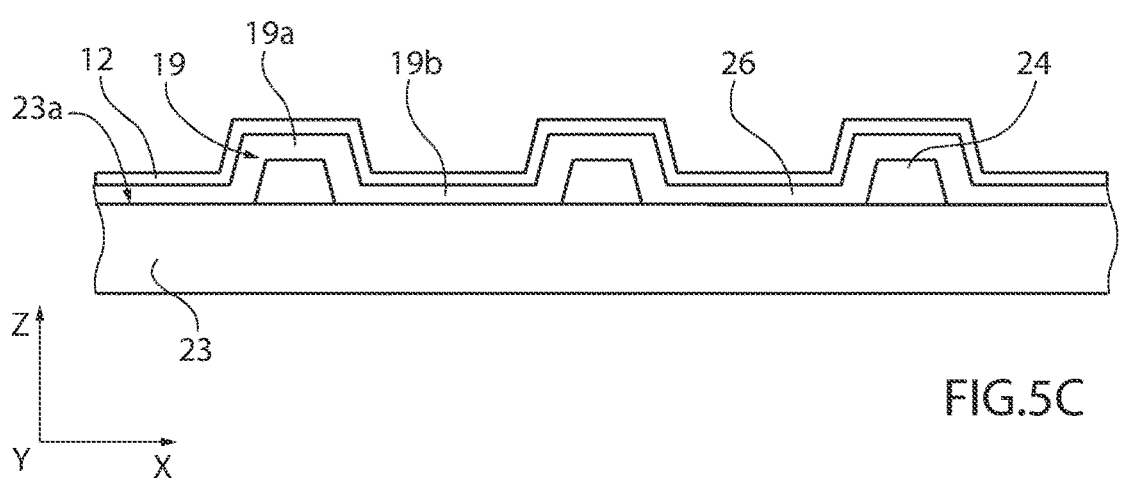

As shown in FIG. 5C, a further oxide layer 26 is then deposited on the top surface 23a of the active layer 23; this further oxide layer 26 covers the underlying remaining portions of the thermal-oxide layer 24 and fills the bottom of the previously formed openings 25 (in contact with the aforesaid top surface 23a). In particular, this further oxide layer 26 forms, together with the remaining portions of the thermal-oxide layer 24, the dielectric region 19 of the piezoelectric microelectromechanical structure 10, in particular the corresponding projections 19a, at the aforesaid remaining portions of the thermal-oxide layer 24, and the corresponding recesses 19b, at the aforesaid openings 25.

A conductive layer is then deposited so as to form, on the dielectric region 19, the bottom-electrode region 12.

Figure 5D:
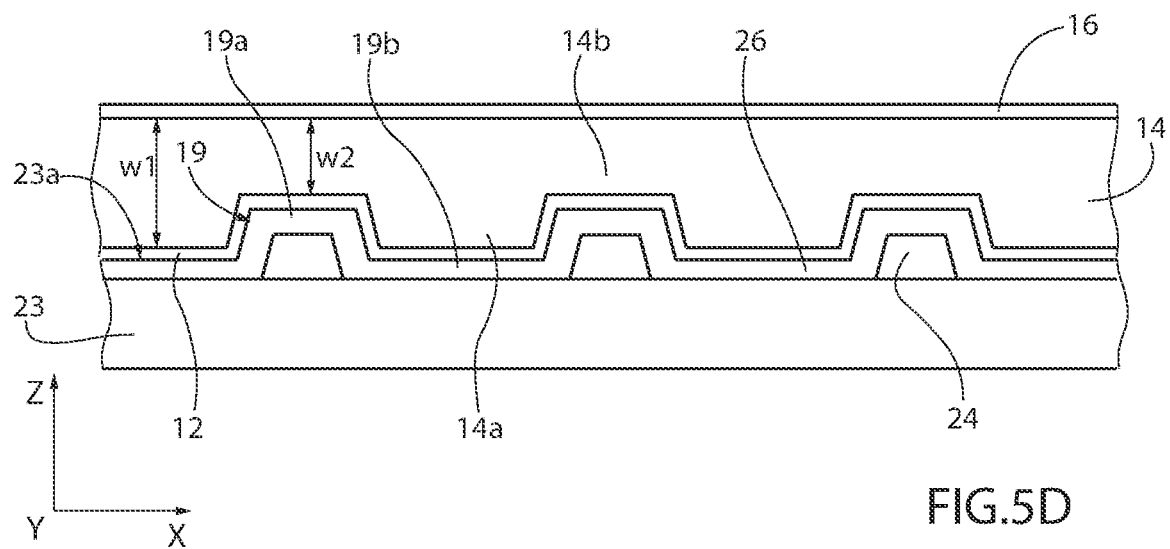

Next, as shown in FIG. 5D, the step of sol-gel deposition by means of spin coating is carried out to form the piezoelectric material region 14 on the bottom-electrode region 12.

In particular, as mentioned previously, thanks to the intrinsic capacity of planarization of the PZT thin film thus formed, the resulting piezoelectric material region 14 has a variable section with the projections 14a having the first thickness w1 and the recesses 14b having the second thickness w2 along the same vertical axis z.

On the piezoelectric material region 14, in particular on the corresponding planar top surface (in the horizontal plane xy), a further conductive layer is then deposited to form, on the dielectric region 19, the top-electrode region 16.

Figure 5E:
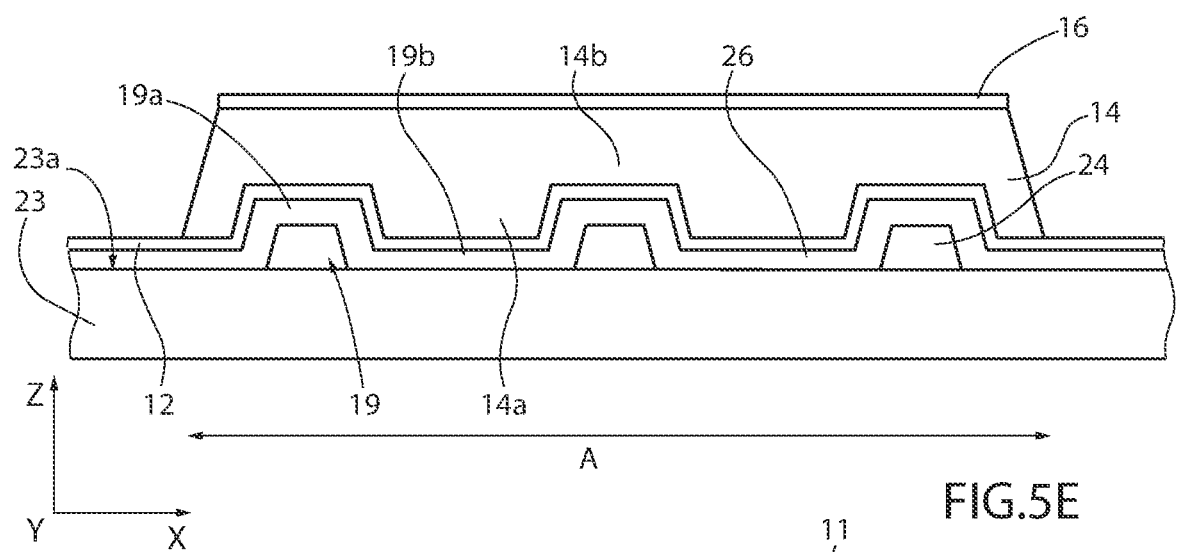

Next, as shown in FIG. 5E, patterning of the top-electrode region 16 and of the piezoelectric material region 14 is carried out, by means of a dry photolithographic etching using a first etching mask (here not illustrated). In particular, with this etching, the total size A occupied by the piezoelectric microelectromechanical structure 10 along the first horizontal axis x is defined.

Figure 5F:
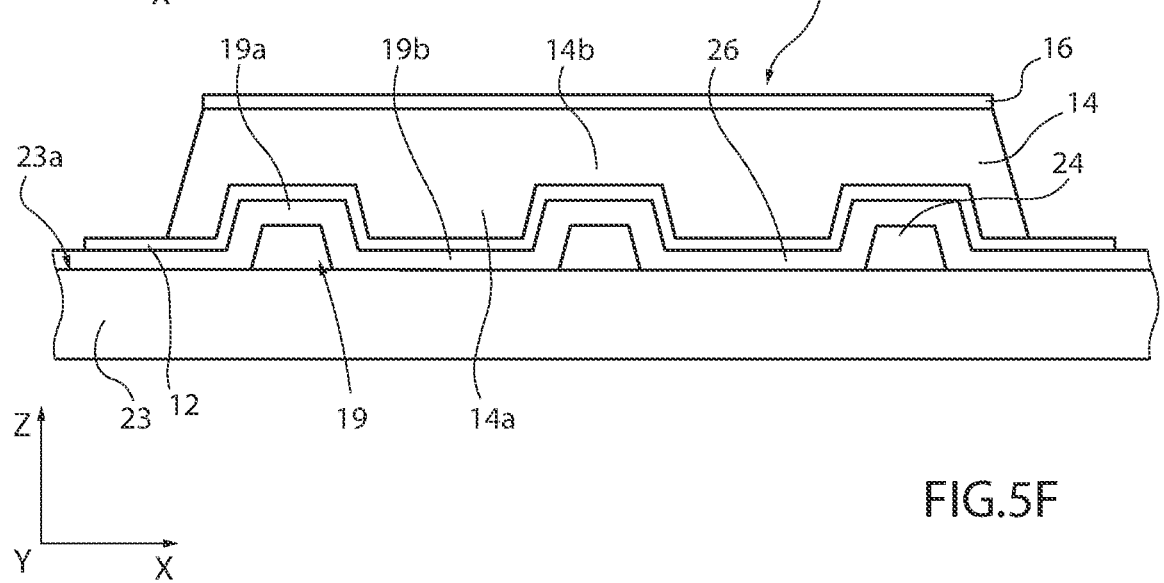

Next, as shown in FIG. 5F, patterning of the bottom-electrode region 12 is carried out, by means of a dry photolithographic etching using a second etching mask (which is not illustrated either), having dimensions such as to entirely cover the piezoelectric material region 14 and the top-electrode region 16, which have been defined in the previous step of the manufacturing process. At the end of this patterning step, the piezoelectric stack 11 of the piezoelectric microelectromechanical structure 10 is thus completely formed.

Figure 5G:
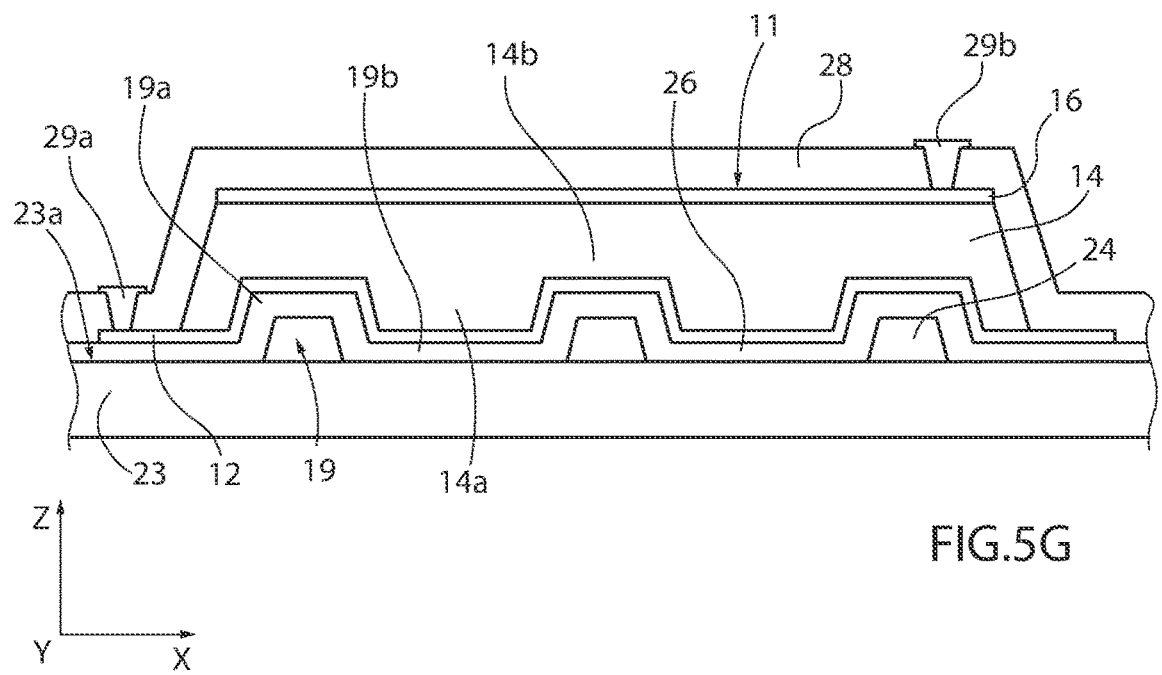

As shown in FIG. 5G, a passivation layer 28 is next deposited on the piezoelectric stack 11; the same passivation layer 28 is then subjected to etching to form through openings, which are filled with conductive material for the formation of a first conductive via 29a and a second conductive via 29b through the passivation layer 28, which are designed to contact the bottom-electrode region 12 and, respectively, the top-electrode region 16.

Figure 5H:
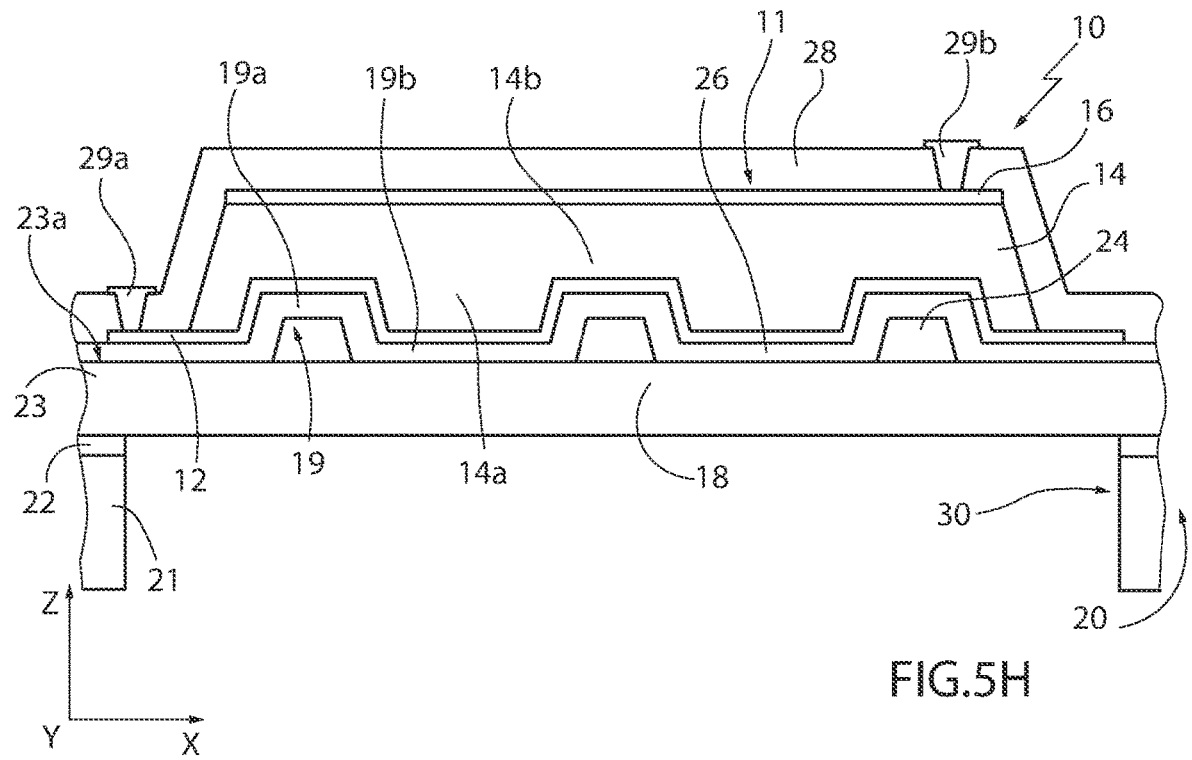

As shown in FIG. 5H, the manufacturing process terminates with release, starting from the aforesaid active layer 23, of the supporting element 18, in this case configured as a membrane, by means of a dry etching from the back of the supporting layer 21 of the SOI wafer 20, which leads to formation of an opening 30, underneath the supporting element 18.

A further embodiment of the present solution is now described, with the piezoelectric microelectromechanical structure 10 operating jointly as a piezoelectric actuator and as a piezoelectric detector. This solution may be advantageously used for providing an ultrasonic transducer, which is able to transmit ultrasound waves, at a frequency higher than 20 kHz, and moreover receive the echo of the waves reflected by an obstacle, for example to obtain time of flight (ToF) information from processing of the reflected signal.

Figure 6:
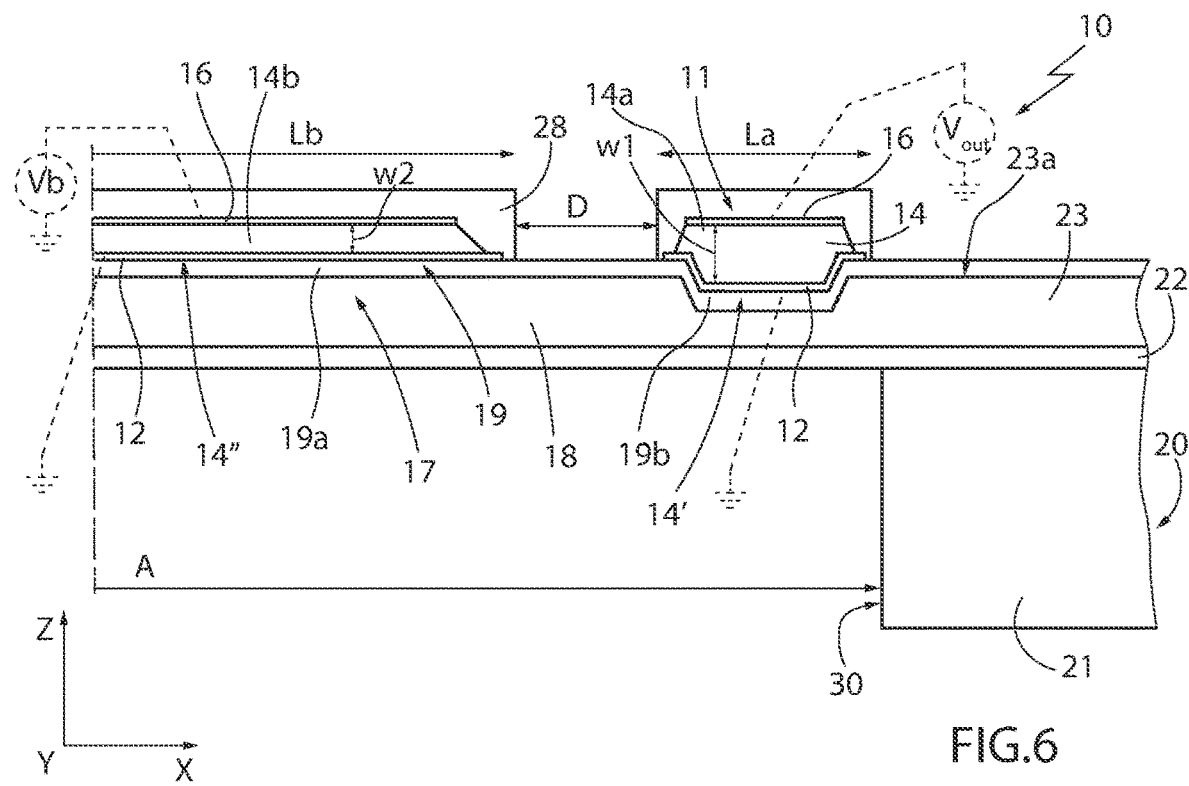
FIGS. 6 and 7A are schematic sectional views of a thin-film piezoelectric MEMS structure, according to further embodiments.

As shown in FIG. 6, the first area 14' of the piezoelectric material region 14, with the first thickness w1 along the vertical axis z (in FIG. 6, a projection 14a is shown defining said first area 14'), contributes (with an associated electronic circuitry, here not illustrated) to providing the piezoelectric detector for detecting ultrasound waves reflected as echo; whereas the second area 14", with the second thickness w2 along the same vertical axis z, smaller than the first thickness w1 (in the figure a recess 14b is shown defining said second area 14"), contributes (with an associated electronic circuitry, here not illustrated) to providing the piezoelectric actuator for generation of the ultrasound waves.

Consequently, in this embodiment, the first area 14' and the second area 14" of the piezoelectric material region 14 are separate and distinct (instead of being continuous and uniform, as in the first embodiment discussed previously with reference to FIG. 2), arranged at a separation distance D along the first horizontal axis x; moreover, separate and distinct respective bottom-electrode and-top electrode regions 12, 16 are provided, respectively for biasing the piezoelectric actuator by means of a biasing voltage Vb and for reading an output signal Vout supplied by the piezoelectric detector.

In general, the presence of the piezoelectric stack 11 with variable section enables optimization of the detection performance, without penalizing the actuation performance. In fact, the greater thickness of the piezoelectric material region 14 at the first area 14' dedicated to detection allows to have a greater distance between the top and bottom electrodes 12, 16 and, consequently, a smaller capacitance to be charged during operation as detector (in a known manner, the capacitance being inversely proportional to the distance between the electrodes) and a greater detection voltage acquired at output between the same electrodes.

Simulations and experimental tests for the disclosed structure have shown the possibility of obtaining an output voltage Vout that is substantially doubled, by exploiting the aforesaid variable section of the piezoelectric stack 11, as compared to a traditional solution with uniform thickness that is constant throughout the piezoelectric material region 14.

As will be evident, a same bottom electrode could alternatively be used for the piezoelectric actuator and the piezoelectric detector, the common bottom electrode constituting in this case a same ground reference.

Figure 7A:
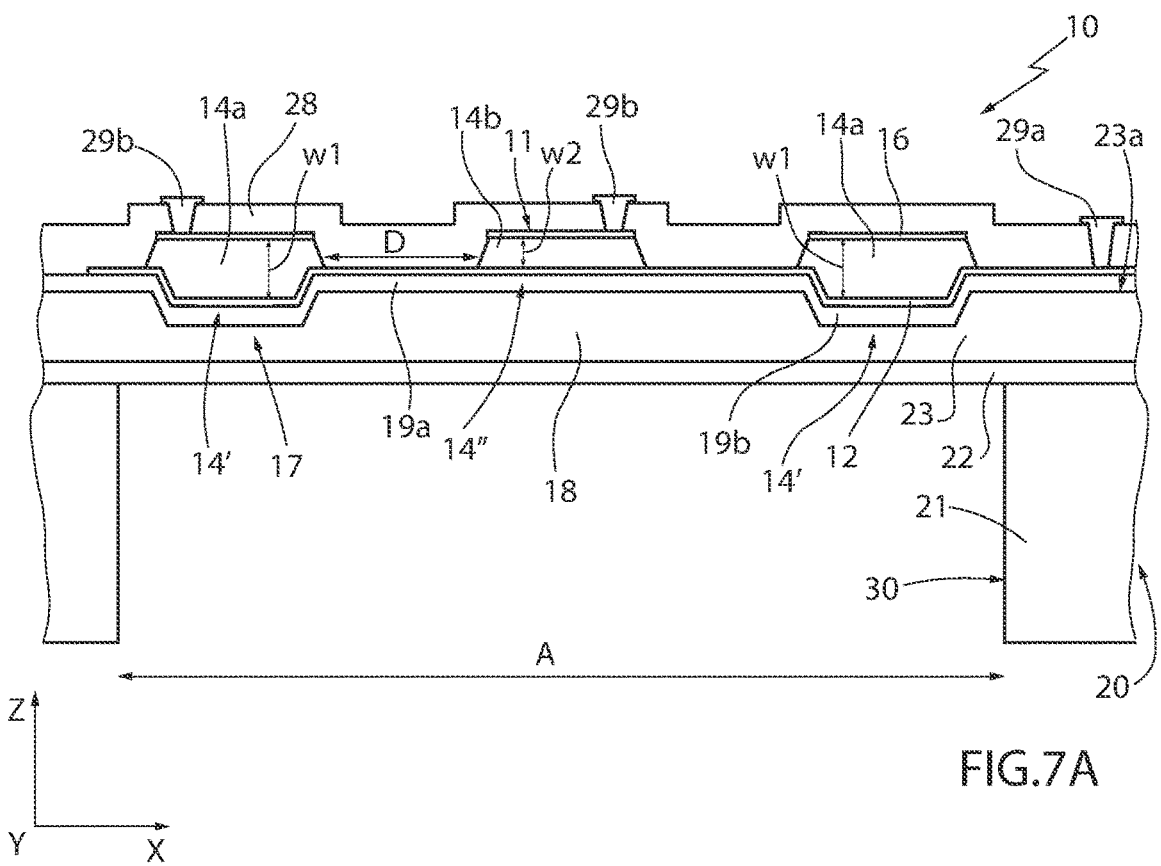

In this regard, FIG. 7A shows a further embodiment of the piezoelectric microelectromechanical structure 10, in which a single bottom-electrode region 12 is present, in common for the projections 14a and the recesses 14b of the piezoelectric material region 14 (which has, also in this case, the first and second areas 14', 14" that are distinct and separate from one another, dedicated, respectively, to piezoelectric detection and actuation).

Furthermore, in this embodiment, the aforesaid projections 14a of the piezoelectric material region 14 are obtained only in part in the underlying dielectric region 19 (as in the embodiments discussed previously), given that they extend also through a surface portion of the underlying supporting element 18; in other words, in this embodiment, the patterned structure 17 underneath the piezoelectric stack 11, which determines the variable section thereof, is jointly defined by the aforesaid dielectric region 19 and by the aforesaid top portion of the supporting element 18.

Figure 7B:
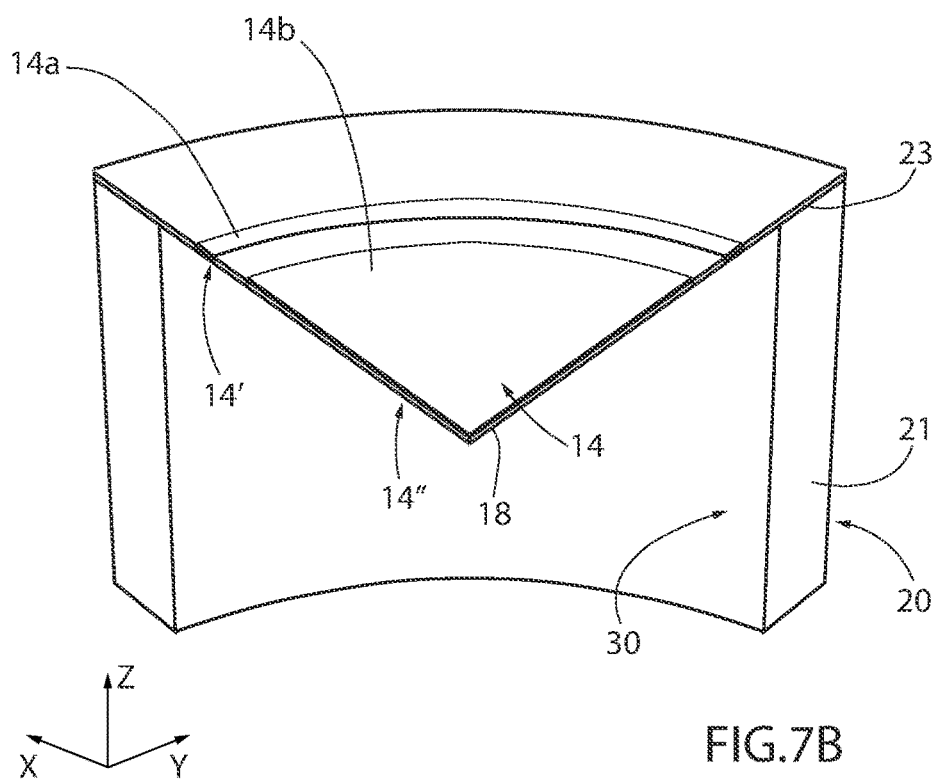
FIG. 7B is a perspective top view of a piezoelectric stack of the MEMS structure of FIG. 7A.

As schematically shown also in FIG. 7B, in a possible embodiment the projections 14a of the piezoelectric region 14 define a ring around the recess 14b, arranged at the center and having a substantially circular shape in plan view; this ring is moreover arranged at the periphery of the membrane defined by the supporting element 18, which may itself have a circular shape in plan view, or a generically polygonal shape.

The position of the projections 14a, dedicated, as discussed, to piezoelectric detection, in this case corresponds to the area of greater stress of the membrane, so as to maximize the detection sensitivity.

It will be noted that the value of the distance D between the first and second areas 14', 14" of the piezoelectric material region 14 along the first horizontal axis x (i.e., in the direction of separation in the horizontal plane xy between the first and second areas 14', 14") is a further factor that affects the degree of piezoelectric response and the value of the output voltage Vout provided by the piezoelectric microelectromechanical structure 10.

Considering a width of the projections 14a along the first axis x approximately equal to 24 μm and a width of the recess 14b along the same first axis x approximately equal to 1232 μm, a value of the first thickness w1 equal to 2 μm, a value of the second thickness w2 equal to 1 μm, a thickness along the vertical axis z of the dielectric region 19 of 0.5 μm, and a thickness of the supporting element 18 of 4 μm, the following values are found for maximum displacement T_max along the vertical axis z of the piezoelectric detector (i.e., in the first area 14' of the piezoelectric material region 14) and of maximum output voltage Vout_max as the distance D varies, applying a biasing voltage of 5 Vdc+50 mVpp at 68 kHz to the piezoelectric actuator (i.e., at the second area 14" of the same piezoelectric material region 14): D=100 μm, T_max=2.5 μm, Vout_max=0.05 V; D=150 μm, T_max=2.8 μm, Vout_max=0.12 V; D=200 μm, T_max=2.8 μm, Vout_max=0.175 V; D=250 μm, T_max=2.2 μm, Vout_max=0.08 V; and D=300 μm, T_max=2.2 μm, Vout_max=0.0055 V.

In the configuration described, it is therefore advantageous to have a distance D between the first and second areas 14', 14" of the piezoelectric material region 14 along the first horizontal axis x approximately equal to 200 μm. In the same configuration, but on the hypothesis (as in known solutions) of using a uniform thickness for the piezoelectric material region 14 (equal to 1 μm), a maximum output voltage Vout_max of 0.09 V, which is equal to approximately half the value that can be obtained with the solution described previously, is achieved with the piezoelectric material region 14 having a variable section.

With reference once again to the embodiment of FIG. 7A, a possible process for manufacturing the corresponding piezoelectric microelectromechanical structure 10 is now described.

Figure 8A:
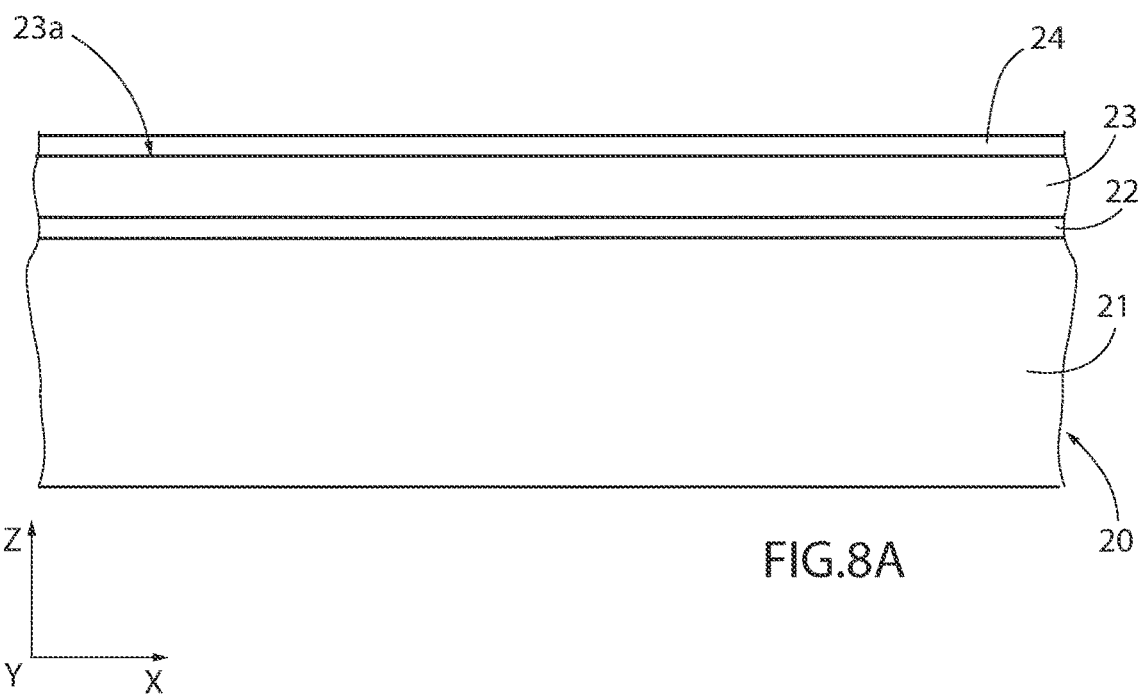
FIGS. 8A-8F are sectional views of the MEMS structure of FIG. 7A in successive steps of a corresponding manufacturing process.

As shown in FIG. 8A, also in this case the process starts with the provision of an SOI wafer 20, comprising, stacked on one another, a supporting layer 21, an insulating layer 22

(for example, with a thickness of 0.5 µm), and an active layer 23 (for example, with a thickness of 4 µm), the latter consisting of polycrystalline silicon and having a top surface 23a. Alternatively, also in this case, oxidation of an initial silicon layer and epitaxial growth of an overlying polysilicon layer may be envisaged, followed by planarization of a corresponding top surface, using the CMP (Chemical Mechanical Polishing) technique.

The process initially envisages growth of a thermal-oxide layer 24, on the top surface 23a of the active layer 23, also having, for example, a thickness of 0.5 µm.

Figure 8B:
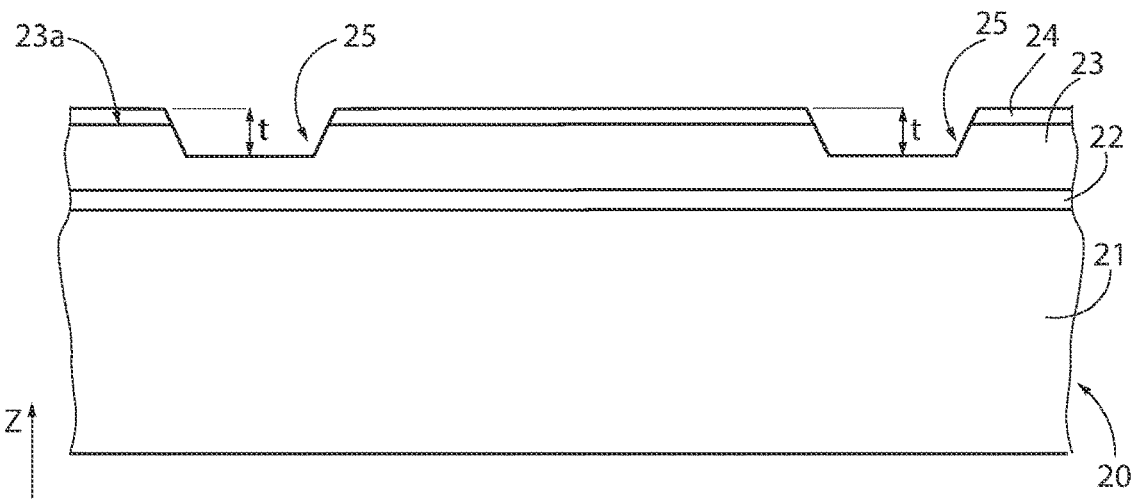

Then, FIG. 8B, the aforesaid thermal-oxide layer 24 and the underlying active layer 23 are subjected to a photolithographic process, for defining, by means of a dry etching and subsequent cleaning, openings 25, which traverse the entire thickness of the thermal-oxide layer 24 and a surface portion of the active layer 23; for example, these openings 25 have an extension t of 1 µm along the vertical axis z. The openings 25 define, for example, a ring in plan view, internally to which the first area 14' of the piezoelectric material region 14 (see in this regard also the foregoing discussion) will be formed.

Figure 8C:
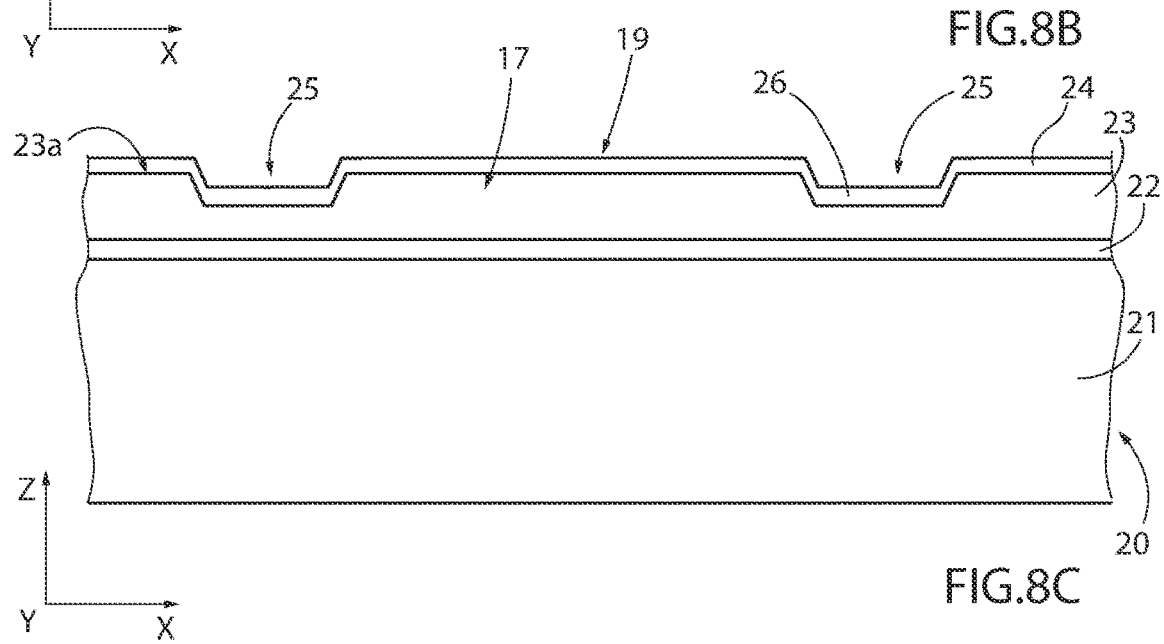

As shown in FIG. 8C, a further oxide layer 26 is then thermally deposited, filling the bottom of the previously formed openings 25. In particular, the further oxide layer 26 forms, together with the remaining portions of the thermal-oxide layer 24, the dielectric region 19 of the piezoelectric microelectromechanical structure 10 (and part of the patterned structure 17).

Figure 8D:
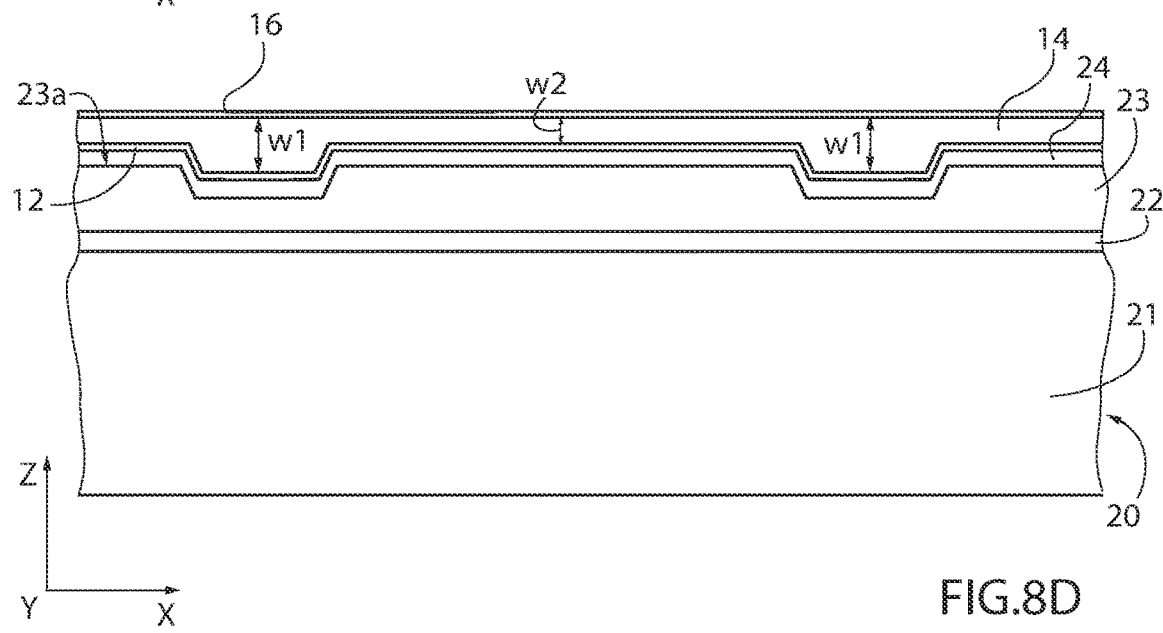

As shown in FIG. 8D, a conductive layer is then deposited so as to form the bottom-electrode region 12 on the dielectric region 19.

This step is followed by spin coating sol-gel deposition, for the formation of the piezoelectric material region 14 on the bottom-electrode region 12.

In particular, as previously mentioned, thanks to the intrinsic capacity of planarization of the PZT thin film thus formed, the resulting piezoelectric material region 14 has a variable section with the first thickness w1 at the openings 25 previously formed, and the second thickness w2 elsewhere.

A further conductive layer is then deposited on the piezoelectric material region 14, in particular on the corresponding planar top surface (in the horizontal plane xy), so as to form, above the dielectric region 19, the top-electrode region 16.

Figure 8E:
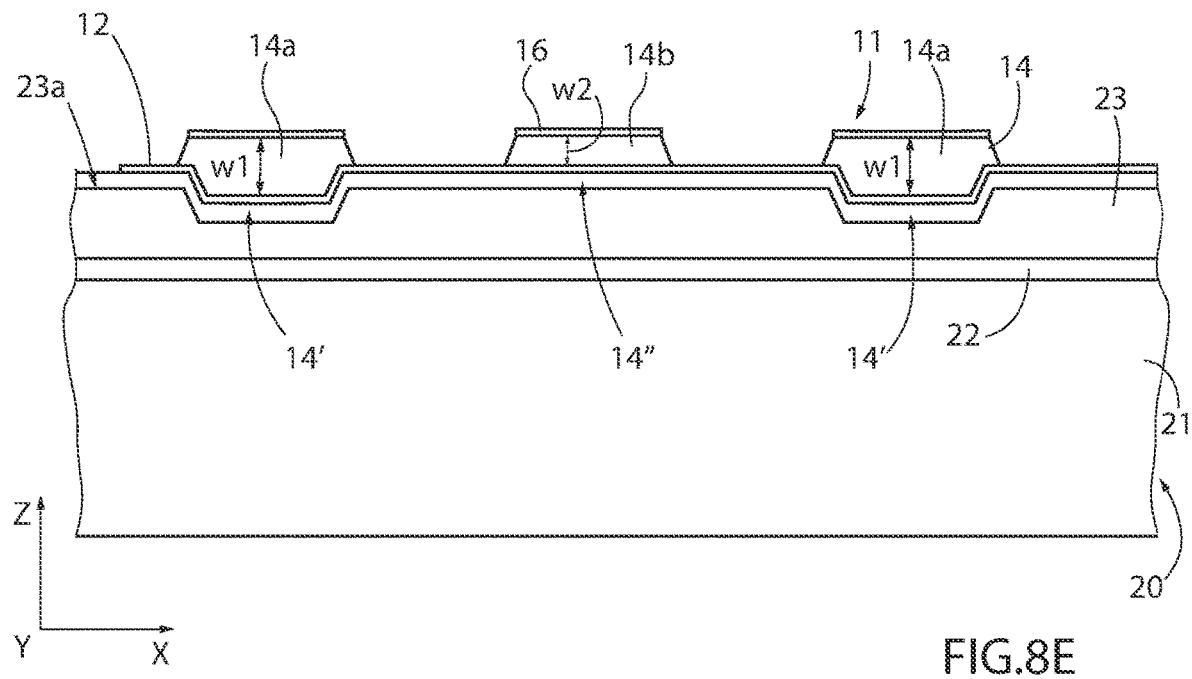

Next, as shown in FIG. 8E, patterning of the top-electrode region 16 and of the piezoelectric material region 14 is carried out by means of a dry photolithographic etching by using an etching mask. Following this etch, the first and second areas 14', 14" of the piezoelectric material region 14 are in particular defined, which are separate and distinct from one another; moreover, the respective top-electrode regions 16 are defined (in this case the bottom-electrode region 12 being, instead, in common).

Figure 8F:
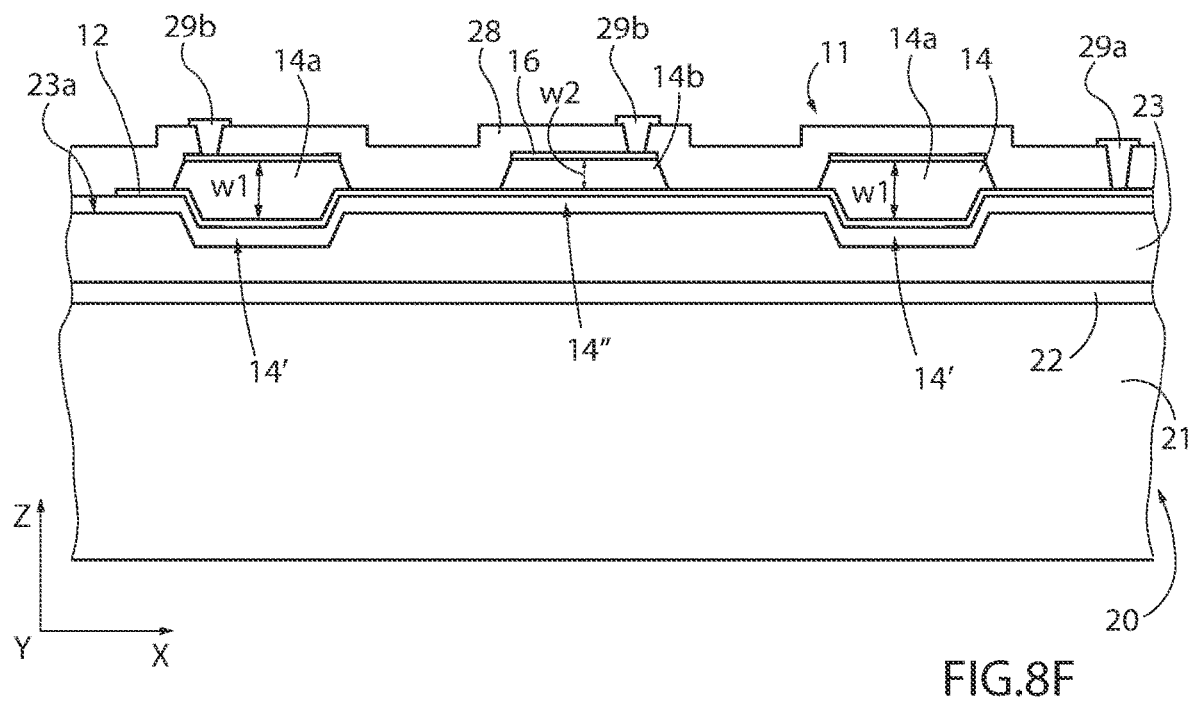

Next, as shown in FIG. 8F, a passivation layer 28 is deposited on the piezoelectric stack 11, which is then subjected to etching for formation of through openings, which are then filled with a conductive material so as to form a first conductive via 29a and a second conductive via 29b through the same passivation layer 28, which are designed to contact, respectively, the bottom-electrode region 12 and, in this case, in a separate and independent manner, the top-electrode regions 16 associated to the first and second areas 14', 14" of the piezoelectric material region 14.

With reference once again to what is shown in FIG. 7A, the manufacturing process terminates with release of the supporting element 18, in this case configured as a membrane, by means of a dry etching from the back of the supporting layer 21 of the SOI wafer 20, which leads to formation of the opening 30 underneath the same supporting element 18.

The advantages of the described solution emerge clearly from the foregoing discussion.

In any case, it is again underlined that formation of the piezoelectric stack 11 with the piezoelectric material region 14 having a variable thickness enables an improvement in the piezoelectric performance, both as regards piezoelectric actuation (in terms of displacement that can be obtained) and as regards piezoelectric detection (in terms of sensitivity).

Advantageously, the manufacturing process does not envisage substantial modifications as compared to known solutions, therefore not entailing a substantial increase in terms of time and costs; in fact, as described in detail, the intrinsic capacity of planarization of sol-gel deposition of the PZT material is exploited in order to provide the aforesaid piezoelectric stack 11 having a variable section, on the underlying patterned structure 17.

Finally, it is clear that modifications and variations may be made to what has been described and illustrated herein, without thereby departing from the scope of the present invention, as defined in the appended claims.

In particular, as on the other hand already highlighted previously, the aforesaid patterned structure 17 may be obtained just in the dielectric region 19 underlying the piezoelectric stack 11, or may also extend through the surface portion of the underlying layer of material in which the supporting element 18 of the piezoelectric stack 11 is defined.

In addition, different shapes and configurations may be envisaged for the aforesaid patterned structure 17 and for the piezoelectric material region 14, different from the strip-like or ring-like configurations represented previously.

For instance, the projections 14a of the piezoelectric material region 14 could have an elliptical shape in plan view, be arranged in the form of a grating or as concentric rings, either continuous or interrupted but connected in series through a metallization, with the aim once again of improving the performance (for example, of reducing the capacitance and increasing the voltage generated in the piezoelectric detector case).

The supporting element 18 could moreover have different shapes or configurations, for example being made by cantilever elements or the like.

It is also highlighted that the solution described may possibly be used in combination with other known solutions to improve piezoelectric performance, such as envisaging use of a doped-PZT solution or a so-called gradient-free approach in order to obtain a further improvement of performance.

Finally, it is clear that the solution described may be advantageously applied to all MEMS devices in which piezoelectric actuation and/or detection are used, for example in print-heads, micromirrors, ultrasound generators, linear actuators, micro-tweezers, nano-positioners for hard disks, etc.

The invention claimed is:

1. A process for manufacturing a piezoelectric microelectromechanical structure, comprising:
   forming a piezoelectric stack having a main extension in a horizontal plane and a variable section in a plane transverse to said horizontal plane;
   wherein forming the piezoelectric stack comprises forming, stacked on one another: a bottom-electrode region;

a piezoelectric material region, constituted by a lead zirconate titanate (PZT) film, arranged on the bottom-electrode region; and a top-electrode region arranged on the piezoelectric material region;

wherein the piezoelectric material region has, as a result of said variable section, a first thickness along a vertical axis transverse to said horizontal plane at a first area, and a second thickness along said vertical axis at a second area, the second thickness being smaller than the first thickness;

forming a patterned structure having respective projections and respective recesses over an active layer of a wafer of semiconductor material;

wherein forming the piezoelectric stack comprises forming said bottom-electrode region on said patterned structure with said piezoelectric material region having projections with the first thickness that jointly define the first area, and recesses with the second thickness that jointly define the second area; and wherein said piezoelectric stack is arranged on a supporting element configured to undergo deformation along the vertical axis via a piezoelectric effect, said supporting element suspended above an underlying opening and separated from the piezoelectric stack by a dielectric region interposed between said supporting element and the bottom-electrode region;

wherein said patterned structure is defined by said dielectric region.

2. The process according to claim 1, wherein said top-electrode region is formed substantially planar in said horizontal plane and wherein said piezoelectric material region is formed by means of a sol-gel deposition spin-coating technique, having intrinsic planarization characteristics.

3. The process according to claim 1, wherein forming said patterned structure comprises: defining openings through a dielectric layer formed on said active layer; and forming an oxide layer on remaining portions of the dielectric layer and within said openings, said oxide layer constituting, together with the remaining portions of the dielectric layer, the dielectric region interposed between the piezoelectric stack and the active layer.

4. The process according to claim 3, comprising forming said openings also through a surface portion of said active layer.

5. The process according to claim 1, further comprising:
defining the piezoelectric stack and the corresponding top-electrode region, piezoelectric material region, and bottom-electrode region;
depositing a passivation layer on the piezoelectric stack;
forming conductive vias for electrical contact to the bottom-electrode region and to the top-electrode region; and
releasing the supporting element arranged underneath said piezoelectric stack via etching from the back that leads to formation of the opening underneath said supporting element.

* * * * *